United States Patent
Henniger et al.

(10) Patent No.: US 9,497,875 B2
(45) Date of Patent: Nov. 15, 2016

(54) CONTROL DEVICE WITH A GETTER LAYER FOR USE IN A MOTOR VEHICLE

(75) Inventors: Juergen Henniger, Erlangen-Dechsendorf (DE);
(Continued)

(73) Assignee: Conti Temic microelectronic GmbH, Nuremberg (DE)

( * ) Notice: Subject to any disclaimer, the term of this patent is extended or adjusted under 35 U.S.C. 154(b) by 272 days.

(21) Appl. No.: 14/116,411

(22) PCT Filed: May 8, 2012

(86) PCT No.: PCT/DE2012/100131
§ 371 (c)(1),
(2), (4) Date: Dec. 12, 2013

(87) PCT Pub. No.: WO2012/152271
PCT Pub. Date: Nov. 15, 2012

(65) Prior Publication Data
US 2014/0111947 A1  Apr. 24, 2014

(30) Foreign Application Priority Data

May 9, 2011  (DE) .................. 10 2011 100 977
Dec. 21, 2011  (DE) .................. 10 2011 056 742

(51) Int. Cl.
*H01L 21/00* (2006.01)
*H05K 5/06* (2006.01)
(Continued)

(52) U.S. Cl.
CPC ............. *H05K 5/069* (2013.01); *H01L 23/055* (2013.01); *H01L 23/10* (2013.01); *H01L 23/26* (2013.01);
(Continued)

(58) Field of Classification Search
CPC ..................... H01L 23/55; H01L 23/10; H01L 23/26; H05K 5/069; H05K 3/306
See application file for complete search history.

(56) References Cited

U.S. PATENT DOCUMENTS

| | | | |
|---|---|---|---|
| 4,352,119 A | 9/1982 | Bardens et al. | |
| 4,768,081 A | 8/1988 | Moeller | |

(Continued)

FOREIGN PATENT DOCUMENTS

| | | |
|---|---|---|
| DE | 34 42 132 | 5/1986 |
| DE | 39 13 066 | 11/1990 |

(Continued)

OTHER PUBLICATIONS

International Search Report of the International Searching Authority for International Application PCT/DE2012/100131, mailed Jul. 27, 2012, 3 pages, European Patent Office, HV Rijswijk, Netherlands.

(Continued)

*Primary Examiner* — Laura Menz
(74) *Attorney, Agent, or Firm* — W. F. Fasse

(57) ABSTRACT

A control device for a motor vehicle includes a housing having a housing cover and a housing base, a sealing device between the housing cover and the housing base, at least one circuit carrier having electrically conductive tracks, and at least one electronic component disposed on the circuit carrier. The control device further includes at least one conductor structure extending out of the interior of the housing, and at least one electrically conductive connecting line which connects the electronic component to the conductor structure. A getter layer is thermally sprayed on the inner face of the housing to protect the metal parts, which transmit current or data in the interior of the control device, against corrosive gases. The getter layer has a high specific surface area.

20 Claims, 3 Drawing Sheets

(75) Inventors: Matthias Wieczorek, Neunkirchen am Sand (DE); Thomas Urbanek, Nuremberg (DE); Marion Gebhardt, Graefenberg (DE); Bernhard Schuch, Neusitz (DE); Andreas Reif, Roethenbach (DE); Stefan Gottschling, Eckental (DE)

(51) Int. Cl.
*H01L 23/055* (2006.01)
*H01L 23/10* (2006.01)
*H01L 23/26* (2006.01)
*H05K 3/30* (2006.01)

(52) U.S. Cl.
CPC ..... *H05K 3/306* (2013.01); *H01L 2224/48091* (2013.01); *H01L 2224/48228* (2013.01); *H01L 2224/49175* (2013.01); *H01L 2924/16152* (2013.01); *Y10T 29/49139* (2015.01)

(56) References Cited

U.S. PATENT DOCUMENTS

| | | | |
|---|---|---|---|
| 6,423,575 B1 * | 7/2002 | Tran | H01L 23/26 257/682 |
| 7,983,054 B2 | 7/2011 | Eglinger et al. | |
| 8,039,285 B2 | 10/2011 | Souriau et al. | |
| 8,059,407 B2 * | 11/2011 | Eglinger | B60R 16/0239 361/679.01 |
| 8,399,299 B2 | 3/2013 | Baillin | |
| 2005/0238803 A1 * | 10/2005 | Tremel | B01J 20/183 427/180 |
| 2006/0284556 A1 * | 12/2006 | Tremel | H05B 33/04 313/512 |
| 2008/0283989 A1 | 11/2008 | Jeung et al. | |

FOREIGN PATENT DOCUMENTS

| | | |
|---|---|---|
| EP | 2 308 797 | 4/2011 |
| FR | 2 883 099 | 9/2006 |
| JP | 2000-231880 A | 8/2000 |
| JP | 2008-066521 A | 3/2008 |

OTHER PUBLICATIONS

English Translation of PCT International Preliminary Report on Patentability of the International Searching Authority for International Application PCT/DE2012/100131, issued Nov. 9, 2013, 7 pages, European Patent Office, HV Rijswijk, Netherlands.

European Office Action in European Patent Application No. 12 727 271.4, mailed Dec. 22, 2015, 6 pages, with partial English translation, 3 pages.

* cited by examiner

CONTROL DEVICE WITH A GETTER LAYER FOR USE IN A MOTOR VEHICLE

CROSS-REFERENCE TO RELATED APPLICATIONS

This application is the 35 USC 371 National Stage of PCT International Application PCT/DE2012/100131 as filed on 8 May 2012, and claims the 35 USC 119 priorities of German Patent Applications 10 2011 100 977.2 as filed on 9 May 2011 and 10 2011 056 742.9 as filed on 21 Dec. 2011. The entire disclosures of the PCT International Application and of the German Patent Application are incorporated herein by reference.

FIELD OF THE INVENTION

The invention relates to a control device for a motor vehicle, having an electronic component on a circuit carrier sealed within a housing.

BACKGROUND INFORMATION

In motor vehicle construction it has been common for some time to integrate control devices for the engine or transmission into the motor vehicle assembly which is to be controlled, i.e. the engine or transmission. It is in particular the transmission control devices which, as a so called in-situ control device, form an extremely compact unit. Compared with the traditional use of external add-on control devices, this arrangement has enormous advantages as regards quality, costs, weight and functionality. The result is in particular a significant reduction of plug connections and lines which may be susceptible to failure.

If the control device is to be integrated into the transmission, it has to fulfil high requirements with regard to its thermal and mechanical load capacity. Functionality has to be ensured for both a broad temperature range (approximately −40° C. up to 200° C.) and mechanical vibrations (up to approximately 40 g). Moreover, as the control device is surrounded by aggressive media such as gear oil, it has to be oil-tight.

However, in in-situ transmission control devices, the electronic functional components, such as the microcontroller, or bonding pads or bonding wires in the circuit carrier interior space can still be damaged as a result of the unwanted entry of, for example, sulphurous pollution gases due to diffusion from the outside through the seals into the circuit carrier interior space of the control device housing or by gas evolution, for example of sealing materials, the housing or plastic materials. This may potentially cause the control devices to fail completely much sooner than their predicted lifetime expectancy.

In particular, if metal-containing components in the interior space of transmission control devices come into contact with corrosive media such as sulphurous gases, water or moist air, said media attack the metal, leading to its corrosion. It is in particular the oxygen dissolved in water which reacts with the metal. Electrons are withdrawn from the metal, and the positively charged ions can enter into solution.

One way to prevent this is the so-called cathodic corrosion protection. A so-called sacrificial anode is conductively connected to the metal to be protected. The metal to be protected is the cathode, and the less noble metal is the sacrificial anode. The result is a current flowing towards the metal to be protected. The electrons are now withdrawn from the less noble metal. The transport of the charged particles occurs through the direct contact of the two metals or through water or water vapor as an electrolyte.

This method for preventing the corrosion of metal-containing components in the interior space of transmission control devices can not be applied here, as it would lead to undefined leakage currents or even to short circuits.

Another way to prevent such corrosion is described in DE 34 42 132 C2. In a housing, an encapsulated microelectronic element is enclosed by silicone rubber wherein a getter material is dispersed as an ultrafine-grained powder containing a barium-aluminum alloy. This powder, however, is suitable only to a limited extent to bind in particular aggressive gaseous components such as sulphur. Rather, it has shown that silicone rubber has the effect of a sponge, in particular for sulphurous gases, and thus even increases corrosion.

Another way to prevent such corrosion is described in DE 39 13 066 A1. A recess for receiving getter material is formed in the cover of a housing for electronic components. The getter material is covered and fixed by a foil. Immediately before the housing is assembled, the foil is perforated such that the getter material can fulfil its function. This method for preventing corrosion is very complex.

SUMMARY OF THE INVENTION

An object of the present invention is therefore to further develop a control device of the type mentioned at the beginning such that the getter function, in particular for gettering sulphurous gases, is improved.

This object is achieved according to the invention in one or more embodiments of a control device having features as set forth herein.

According to an embodiment of the invention it has been found that in a control device used in particular as an in-situ transmission control device within the transmission of a motor vehicle, the corrosion of the metal parts which transmit current or data in the interior of the control device, such as tracks, bonding pads or bonding wires, by aggressive gases, above all sulphurous gases, is prevented or at least slowed down by applying onto the inner face of the housing a getter layer for absorbing these aggressive pollution gases. A thermally sprayed getter layer is particularly advantageous, as it has a particularly high specific surface area and thus a particularly high absorbency by comparison with getter layers applied, for example, galvanically or by means of CVD.

In a particular embodiment, the getter layer is applied on the inner face of the housing cover selectively such that the contact area between the housing cover and the housing base is not coated with a getter layer. This prevents that a change, which may otherwise occur in the contact surface between the housing cover and the housing base and which is caused by the reaction of the getter layer with the pollution gases, leads to a leak occurring in the housing at this site.

The getter layer is preferably and advantageously made of a metal such as aluminum, copper, silver, steel or a silver-palladium alloy, these layers being relatively easy and cost-effective to manufacture.

If the conductor structure is designed as a flexible conductor foil with open contact regions disposed at each of the ends, the layout design of the connection between the electronic components in the interior of the control device and the components outside the control device, such as, for example, sensors and actors, is easier and more space-saving than with a rigid PCB, the open contact regions of the conductor foil being designed as bonding pads at least in the interior of the control device.

An electronic component on the circuit carrier, in particular an uncased microelectronic module, also referred to as a bare die, is connected, by means of a connecting line, in an electrically conductive manner to the open contact regions or bonding pads of the conductor foil. This connecting line is usually a bonding wire made of a highly conductive metal such as, for example, aluminum or gold, representing an electrical connection which has proven to be reliable.

As an additional protection against corrosive gases the circuit carrier and the connecting line can be enclosed by a soft plastic layer. This also offers protection against components becoming detached, e.g. from the circuit carrier in the case of extreme vibration stresses.

BRIEF DESCRIPTION OF THE DRAWINGS

Further features, advantages and details of the invention can be gathered from the following description, wherein a preferred exemplary embodiment will be explained in greater detail with reference to the attached drawings in which.

DETAILED DESCRIPTION OF EXAMPLE EMBODIMENTS OF THE INVENTION

Figure 1:
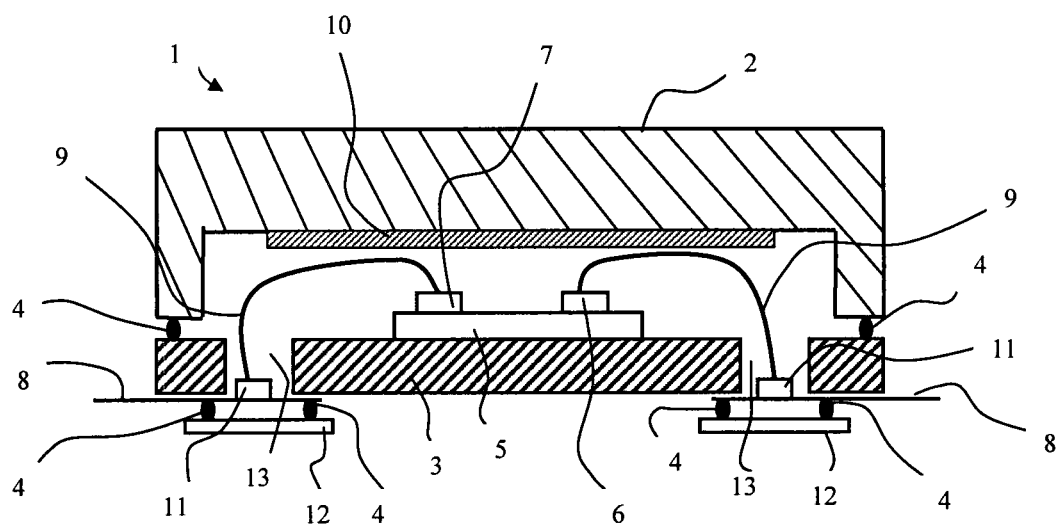
FIG. 1 shows a section through a control device 1.

According to FIG. 1, a control device 1 for a motor vehicle comprises a housing base 3 and a housing cover 2. The housing base 3 and the housing cover 2 form an interior space wherein a circuit carrier is present. The circuit carrier 5 is glued to the housing base 3, in particular using an electrically insulating thermally conductive adhesive. If the housing base is made of a metal material, for example, then the heat developing on the circuit carrier 5 is conducted away to the surrounding area of the housing base 3 particularly well. At least one electronic component 6, 7 are disposed on the circuit carrier 5. The housing base 3 has a break-through 13 in the region encircling the circuit carrier 5, adjacent to an electronic component 6, 7. For illustration, reference is also made to FIG. 2 in this context. At the break-through 13, a conductor structure 8 is attached on the exterior surface of the housing base 3, i.e. the surface facing away from the circuit carrier, said structure preferably being designed as a flexible foil conductor, in short, a flexfoil conductor. The flexfoil conductor is, for example, a polyimide foil having a plurality of electrically conductive tracks, said tracks being insulated from one another, however.

A contact region 11 is disposed at the end section of the flexfoil conductor 8 in the interior of the control device. The flexfoil conductor 8 is placed over the break-through 13 such that it entirely covers the break-through 13 with its end section 10 and that the electrical contact region 11 is entirely within the break-through 13, i.e. does not come into contact with the housing base 3. Otherwise there would be the risk of a short circuit. The electrical contact region 11 on the flexfoil conductor 8 within the break-through 13, in turn, is electrically connected to electronic and/or electrical components, such as sensors or actors, outside the control device via the tracks in the flexfoil conductor 8 in a manner not shown. The electrical connecting lines 9, which are usually bonding wires made of a highly conductive metal such as aluminum or gold, in turn represent the electrical contact between the electrical components 6, 7 or the conductor tracks on the circuit carrier 5 and the corresponding electrical contact regions 11 within the break-through 13. The cover plate 12 covers the break-through 13 entirely and effects an oil-tight connection between the flexfoil conductor 8 and the housing base 3. The coupling of the cover plate 12 to the housing base 3 can be achieved by a non-positive or positive connection such as screwing or caulking.

As shown in FIG. 1, a seal 4 encircling the break-through 13 is present between the flexfoil conductor 8 and the cover plate 12 in order to ensure that there is additional safety as regards oil-tightness. The seal 4 can be sprayed to the cover plate 12 for the sake of convenience.

The housing base 3 is coupled to the housing cover 2 in an oil tight manner via a seal 4. Particularly in in-situ transmission control devices, however, corrosion of the metal parts which transmit current or data in the interior of the control device, such as, for example, the electronic components 6, 7 such as microcontrollers, the tracks on the circuit carrier 5, of open contact areas 11 on the flexfoil conductors 8 or boding wires 9, said corrosion being caused by the unwanted entry of, for example, sulphurous pollution gases from the gear oil into the interior space of the housing 1, can still occur due to the extreme external conditions. This may potentially cause the control devices to fail completely much sooner than their predicted lifetime expectancy.

FIG. 1 shows a getter layer 10 on the inner face of the housing cover 2. The getter layer 10 is in particular sprayed on the inner face of the housing cover 2. A thermally sprayed getter layer 10, applied e.g. by means of cold spraying, has shown to be particularly suitable, as a getter layer 10 applied in this manner has a particularly high specific surface area and thus a particularly high gas absorbency by comparison with getter layers applied, for example, galvanically or by means of CVD. This can either entirely prevent or at least slow down corrosion caused by the pollution gases. This getter layer 10 consists in particular of a metal such as aluminum, copper, silver, silver-palladium alloy or steel. The getter layer 10 thus substantially consists of the same material as the parts 5, 6, 7, 8, 9, 11 in the interior space of the housing 1 which are to be protected.

A preferable feature that can be achieved is that the getter layer 10 has a specific surface area which is many times higher than the combined surface area of the parts 5, 6, 7, 8, 9, 11 to be protected. The getter layer 10, which is able to irreversibly absorb the pollution gases, matches the contour of the inner surface of the housing cover 2 due to the manner in which it is applied. The getter effect of the getter layer 10 is the larger the closer it is disposed relative to the parts 5, 6, 7, 8, 9, 11 to be protected.

In particular in the illustrated embodiment, the getter layer 10 is applied on the inner face of the housing cover 2 selectively such that the contact area between the housing cover 2 and the housing base 3 is not coated with a getter layer 10. This prevents that a change, which may otherwise occur in the contact surface between the housing cover 2 and the housing base 3 and which is caused by the reaction of the getter layer 10 with the pollution gases, leads to a leak occurring in the housing 1 at this site.

To prevent that the getter layer 10 applied to the housing cover 2 reacts with the environment even before the housing 1 is assembled, the housing cover 2 with the getter layer 10 is preferably stored either in an inert gas atmosphere or the getter layer 10 is sprayed on only shortly prior to the assemblage of the housing.

Figure 2:
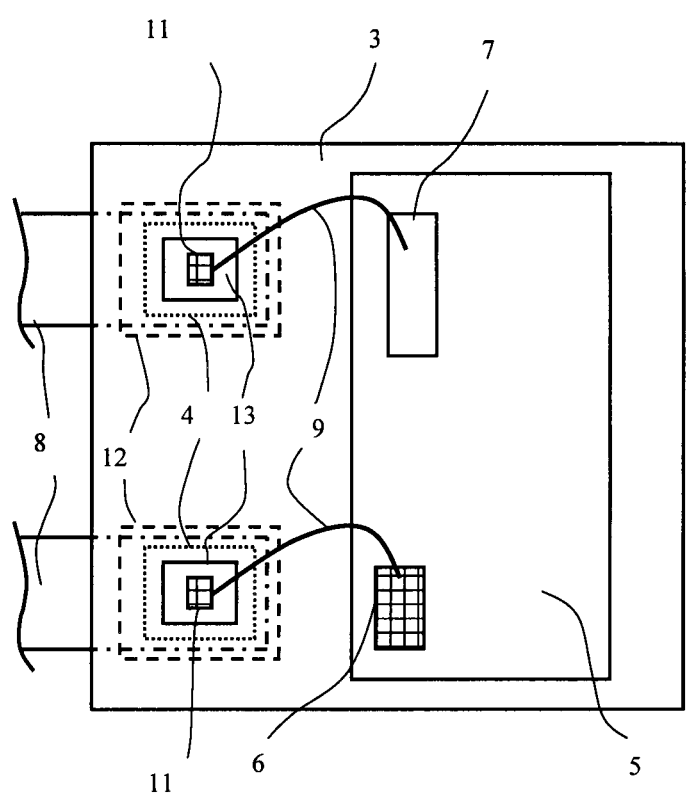
FIG. 2 shows a top view of the interior surface of the housing base.

FIG. 2 shows a top view of the inner face of the housing base 3 and serves only for illustrating the arrangement in the region of a break-through 13. The electrical contact region 11 on the flexfoil conductor 8 is disposed within the break-through 13 such that it does not come into contact with the housing base 3, i.e. such that it cannot cause a short circuit via the mostly metallic housing base 3. The seal 4 extends around the break-through 13 between the flexfoil conductor 8 and the cover plate 12.

Figure 3:
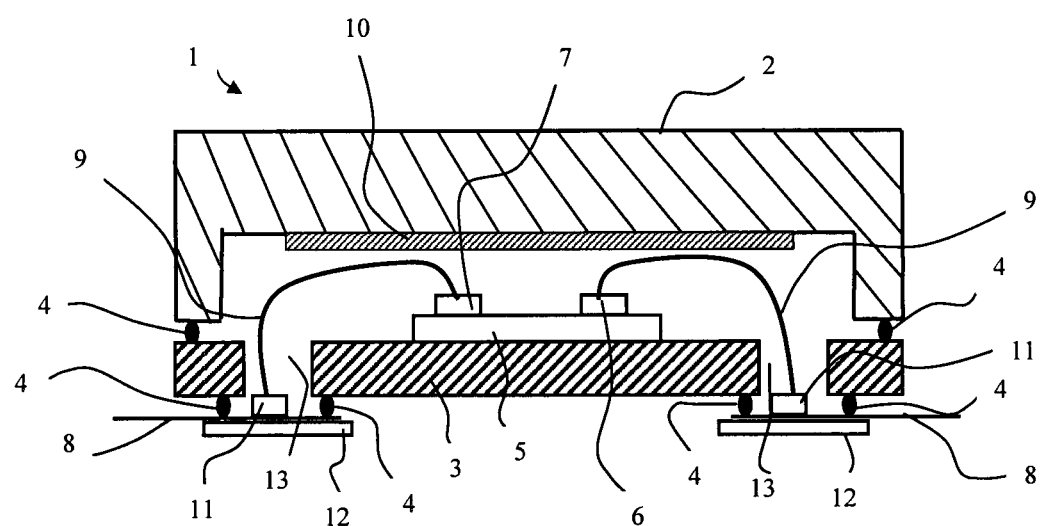
FIG. 3 shows a sectional view similar to FIG. 1, but of an alternative embodiment of a control device.

The seal 4 can, however, also be disposed between the flexfoil conductor 8 and the housing base 3, as shown in FIG. 3.

The present invention has been presented with the help of the above description to explain the principle of the invention and its practical application in the best manner possible. From this disclosure it will be evident, however, the invention can be realized in numerous other embodiments and combinations if appropriately modified.

The invention claimed is:

1. A control device in a motor vehicle, having
   a housing consisting of a housing cover and a housing base,
   a sealing device between the housing cover and the housing base,
   at least one circuit carrier having electrically conductive tracks, and at least one electronic component disposed on the circuit carrier,
   at least one conductor structure extending out of an interior of the housing, and
   at least one electrically conductive connecting line which connects the electronic component to the conductor structure,
   characterised in that
      a getter layer is thermally sprayed on an inner face of the housing and is configured and adapted to protect the circuit carrier, the electronic component, the conductor structure and the connecting line against sulfur-containing gases by gettering the sulfur-containing gases,
      wherein due to being thermally sprayed the getter layer has a particularly high specific surface area in comparison to galvanically applied getter layers, and
      wherein the getter layer is made of a metal selected from aluminum, copper, silver, silver-palladium alloy or steel.

2. The control device according to claim 1, characterised in that the getter layer is selectively applied on only a portion of the inner face of the housing.

3. The control device according claim 2, characterised in that the getter layer is selectively applied on only the portion of the inner face of the housing cover such that a contact area of the sealing device between the housing cover and the housing base is free from the getter layer.

4. The control device according to claim 1, characterised in that the conductor structure is a flexfoil conductor with open contact regions respectively disposed at an end section of the conductor structure.

5. The control device according to claim 4, characterised in that the open contact regions of the conductor structure are configured and arranged as bonding pads at least in the interior of the housing.

6. The control device according to claim 1, characterised in that the connecting line is a bonding wire made of a highly conductive metal selected from aluminum or gold.

7. The control device according to claim 1, characterised in that the electronic component is an uncased microelectronic module.

8. The control device according to claim 1, characterised in that the circuit carrier and the connecting line are enclosed by a soft plastic layer as an additional protection against the sulfur-containing gases.

9. A control device for a motor vehicle, comprising:
   a housing that includes a housing base and a housing cover, and that encloses an interior space therein;
   a seal arrangement arranged between the housing base and the housing cover;
   a circuit carrier having electrically conductive tracks, arranged in the interior space;
   an electronic component disposed on the circuit carrier in the interior space;
   an electrical conductor arrangement that is electrically conductively connected to the electronic component and that extends out of the housing; and
   a getter layer of a getter material disposed on at least a partial surface area of an inner surface of the housing that bounds the interior space, wherein the getter layer has been formed and disposed on at least the partial surface area of the inner surface of the housing by thermal spraying of the getter material onto at least the partial surface area of the inner surface of the housing, wherein due to being formed by the thermal spraying the getter layer has a high specific surface area that is higher than a specific surface area of a comparative getter layer formed by galvanic deposition or by CVD, and wherein the getter layer is effective to getter at least a sulfurous gas component from the interior space thereby improving protection against corrosion of at least one of the electronic component, the electrically conductive tracks and the electrical conductor arrangement within the interior space.

10. The control device according to claim 9, wherein the high specific surface area of the getter layer is many times higher than the specific surface area of the comparative getter layer formed by galvanic deposition or by CVD.

11. The control device according to claim 9, wherein the getter layer is disposed only on the partial surface area of the inner surface of the housing and is not disposed on an interface area of the seal arrangement between the housing cover and the housing base.

12. The control device according to claim 9, wherein the electronic component is an uncased microelectronic module.

13. The control device according to claim 9, further comprising a soft plastic layer disposed on the circuit carrier and at least a part of the electrical conductor arrangement as an additional protection against corrosion.

14. The control device according to claim 9, wherein the inner space is a sealed space enclosed by the housing and sealed by the seal arrangement.

15. A method of making the control device according to claim 9, comprising the steps:
   a) arranging, on the housing base, the circuit carrier with the electronic component thereon;
   b) arranging the electrical conductor arrangement to lead from the electronic component out through the housing base;
   c) thermally spraying the getter material onto the partial surface area of the inner surface of the housing cover to form the getter layer; and
   d) closing the housing cover onto the housing base, and arranging the seal arrangement therebetween, to form the interior space enclosed and sealed within the housing.

16. The control device according to claim 9, wherein the getter material consists essentially of aluminum or copper.

17. The control device according to claim 9, wherein the getter material consists essentially of silver or silver-palladium alloy.

18. The control device according to claim 9, wherein the getter material consists essentially of steel.

19. The control device according to claim 1, wherein the getter material consists essentially of aluminum or copper.

20. The control device according to claim 1, wherein the getter material consists essentially of steel.

\* \* \* \* \*